US012813140B2

(12) United States Patent
Tong et al.

(10) Patent No.: US 12,813,140 B2
(45) Date of Patent: Nov. 24, 2026

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Kemeng Tong, Beijing (CN); Xiangdan Dong, Beijing (CN); Fan He, Beijing (CN); Cong Fan, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 909 days.

(21) Appl. No.: 18/023,142

(22) PCT Filed: Mar. 30, 2022

(86) PCT No.: PCT/CN2022/084105
§ 371 (c)(1),
(2) Date: Feb. 24, 2023

(87) PCT Pub. No.: WO2023/184244
PCT Pub. Date: Oct. 5, 2023

(65) Prior Publication Data
US 2024/0276844 A1 Aug. 15, 2024

(51) Int. Cl.
*H10K 59/80* (2023.01)
*G06F 3/041* (2006.01)
(Continued)

(52) U.S. Cl.
CPC ....... *H10K 59/8731* (2023.02); *G06F 3/0412* (2013.01); *G06F 3/04164* (2019.05);
(Continued)

(58) Field of Classification Search
CPC .. H10K 59/8731; H10K 59/131; H10K 59/40; H10K 2102/311; H10K 59/00;
(Continued)

(56) References Cited

U.S. PATENT DOCUMENTS

2017/0277288 A1 9/2017 Choi et al.
2018/0151662 A1 5/2018 Rhe et al.
(Continued)

FOREIGN PATENT DOCUMENTS

CN 107230680 A 10/2017
CN 108110031 A 6/2018
(Continued)

OTHER PUBLICATIONS

CN 202280000632.0 first office action dated Dec. 21, 2025.

*Primary Examiner* — Adam R. Giesy
(74) *Attorney, Agent, or Firm* — IPro, PLLC

(57) ABSTRACT

Provided in the present disclosure are a display substrate and a display device. The display substrate includes: a base substrate, including: a display region and a peripheral region outside the display region, where the peripheral region includes a bending region, a first subregion, and a second subregion; a plurality of first connecting leads, extending from the first subregion to the second subregion through the bending region; an encapsulation layer, located on a side of the plurality of first connecting leads away from the base substrate; a plurality of first touch signal traces, located on a side of the encapsulation layer away from the plurality of first connecting leads; and a plurality of second connecting leads, located between the encapsulation layer and the plurality of first touch signal traces, or located in the same layer as the plurality of first touch signal traces.

20 Claims, 6 Drawing Sheets

(51) Int. Cl.
*H10K 59/131* (2023.01)
*H10K 59/40* (2023.01)
*H10K 102/00* (2023.01)

(52) U.S. Cl.
CPC ........... *H10K 59/131* (2023.02); *H10K 59/40* (2023.02); *G06F 2203/04102* (2013.01); *H10K 2102/311* (2023.02)

(58) Field of Classification Search
CPC ............... G06F 3/0412; G06F 3/04164; G06F 2203/04102; G06F 2203/04111; G06F 3/041; G06F 3/0443; G06F 3/0446; H10D 86/00
See application file for complete search history.

(56) References Cited

U.S. PATENT DOCUMENTS

| | | | |
|---|---|---|---|
| 2020/0089368 A1 | 3/2020 | Shim et al. | |
| 2021/0202672 A1* | 7/2021 | Kim | H10D 86/451 |
| 2021/0333919 A1 | 10/2021 | Wu et al. | |
| 2022/0283657 A1 | 9/2022 | Cheng et al. | |
| 2022/0317848 A1 | 10/2022 | Li et al. | |

FOREIGN PATENT DOCUMENTS

| | | | |
|---|---|---|---|
| CN | 109148541 | A | 1/2019 |
| CN | 112667106 | A | 4/2021 |
| CN | 112799550 | A | 5/2021 |
| CN | 113161385 | A | 7/2021 |
| JP | 2019140389 | A | 8/2019 |
| WO | 2022047800 | A1 | 3/2022 |

* cited by examiner

DISPLAY SUBSTRATE AND DISPLAY DEVICE

CROSS REFERENCE TO RELATED APPLICATIONS

The present disclosure is a US National Stage of International Application No. PCT/CN2022/084105, filed on Mar. 30, 2022, the entire contents of which are incorporated herein by reference.

FIELD

The present disclosure relates to the field of display technologies, and in particular to a display substrate and a display device.

BACKGROUND

With the fast development of display technology, people's requirements for the appearance and function of mobile phones and other display products are becoming increasingly high, and the challenges in the manufacturing process of display products are becoming more considerable.

In the related art, to reduce the size of a peripheral region and increase the screen-to-body ratio of a display region, it is necessary to bend a fan-out region to the back of a display panel. For a touch display panel, in a bending region, a touch signal trace of a touch module needs to be jumped to a metal layer of the display panel, that is, the touch signal trace needs to be lapped to the metal layer of the display panel through an adapter hole penetrating an insulating layer. However, a distance between a boundary of an inorganic encapsulation layer in the touch display panel and the adapter hole is close. In a patterning process of the inorganic encapsulation layer, if there is a process defect such as inorganic material shading, inorganic material residue easily appears at the adapter hole, and as a result the touch signal trace fails to be lapped to the metal layer, making it impossible to transmit a touch signal.

SUMMARY

Embodiments of the present disclosure provide a display substrate and a display device. The display substrate includes: a base substrate, including: a display region and a peripheral region outside the display region, where the peripheral region includes at least one bending region, a first subregion located between the at least one bending region and the display region, and a second subregion located on a side of the at least one bending region away from the display region; a plurality of first connecting leads, located on a side of the base substrate, where the plurality of first connecting leads extend from the first subregion to the second subregion through the bending region; an encapsulation layer, located on a side of the plurality of first connecting leads away from the base substrate, where the encapsulation layer covers the display region and extends to the first subregion; a plurality of first touch signal traces, located on a side of the encapsulation layer away from the plurality of first connecting leads, where the plurality of first touch signal traces and the plurality of first connecting leads are in one-to-one correspondence; each first touch signal trace includes a first sub-touch signal trace located in the first subregion and a second sub-touch signal trace located in the second subregion; and one end of each first connecting lead is electrically connected to the first sub-touch signal trace, and the other end of the first connecting lead is electrically connected to the second sub-touch signal trace; and a plurality of second connecting leads, located between the encapsulation layer and the plurality of first touch signal traces, or located in the same layer as the plurality of first touch signal traces, where the plurality of second connecting leads and the plurality of first connecting leads are in one-to-one correspondence; and the plurality of second connecting leads penetrate the bending region, and are electrically connected to the first sub-touch signal trace and the second sub-touch signal trace in one-to-one correspondence.

In some embodiments, the display substrate further includes: a plurality of first adapter electrodes and a plurality of second adapter electrodes located between the plurality of first touch signal traces and the encapsulation layer, a first organic insulating layer located between the plurality of first touch signal traces and the plurality of first adapter electrodes, and a first planarization layer located between the plurality of first connecting leads and the encapsulation layer; the plurality of first adapter electrodes are located in the first subregion, and the plurality of second adapter electrodes are located in the second subregion; the first sub-touch signal trace is electrically connected to the plurality of first adapter electrodes through via-holes penetrating the first organic insulating layer, and the second sub-touch signal trace is electrically connected to the plurality of second adapter electrodes through via-holes penetrating the first organic insulating layer; and the plurality of first adapter electrodes and the plurality of second adapter electrodes are respectively electrically connected to the two ends of the first connecting lead through via-holes penetrating the first planarization layer.

In some embodiments, the plurality of second connecting leads are disposed in the same layer as the plurality of first touch signal traces, and the plurality of second connecting leads are integrally connected to the plurality of first touch signal traces.

In some embodiments, the display substrate further includes: a second organic insulating layer, located on a side of the first touch signal trace away from the encapsulation layer, where the second organic insulating layer covers the plurality of second connecting leads.

In some embodiments, the plurality of second connecting leads are disposed in the same layer as the plurality of first adapter electrodes and the plurality of second adapter electrodes, and the plurality of second connecting leads are integrally connected to the plurality of first adapter electrodes and the plurality of second adapter electrodes.

In some embodiments, the first organic insulating layer covers the plurality of second connecting leads.

In some embodiments, the display substrate further includes: a third organic insulating layer, located between the plurality of first adapter electrodes and the encapsulation layer; in the peripheral region, the third organic insulating layer includes a first removal region; an orthographic projection of the first removal region onto the base substrate covers orthographic projections of the bending region and the plurality of first adapter electrodes and the plurality of second adapter electrodes onto the base substrate; and a distance between an edge of the first removal region in the first subregion and the plurality of first adapter electrodes is greater than 0, and a distance between an edge of the first removal region in the second subregion and the plurality of second adapter electrodes is greater than 0.

In some embodiments, the display substrate further includes: a third organic insulating layer, located between the plurality of first adapter electrodes and the encapsulation layer; in the peripheral region, the third organic insulating layer includes a first removal region; an orthographic projection of the first removal region onto the base substrate covers orthographic projections of the bending region and the plurality of first adapter electrodes onto the base substrate; and the orthographic projection of the first removal region onto the base substrate and orthographic projections of the plurality of second adapter electrodes onto the base substrate are not overlapped with each other; and a distance between an edge of the first removal region in the first subregion and the plurality of first adapter electrodes is greater than 0, and a distance between an edge of the first removal region in the second subregion and the plurality of second adapter electrodes is greater than 0.

In some embodiments, the first organic insulating layer covers the edges of the first removal region.

In some embodiments, the encapsulation layer includes an inorganic encapsulation layer and an organic encapsulation layer that are alternately stacked; the inorganic encapsulation layer covers the display region and extends to cover the first subregion; and an edge of the inorganic encapsulation layer in the first subregion is located on a side of the edge of the first removal region in the first subregion close to the display region.

In some embodiments, the encapsulation layer specifically includes: a first inorganic encapsulation layer, a first organic encapsulation layer, a second inorganic encapsulation layer, a second organic encapsulation layer, and a third inorganic encapsulation layer that are stacked.

In some embodiments, the first connecting lead includes: a first sub-connecting lead and a second sub-connecting lead; and the display substrate further includes: a plurality of third connecting leads, located between the base substrate and the plurality of first connecting leads, and are in one-to-one correspondence with the plurality of first connecting leads; and one end of each third connecting lead is electrically connected to the first sub-connecting lead, and the other end of the third connecting lead is electrically connected to the second sub-connecting lead.

In some embodiments, the plurality of third connecting leads are located in the second subregion.

In some embodiments, the display substrate further includes: a second planarization layer, located between the plurality of first connecting leads and the plurality of third connecting leads, where in the bending region, only the second planarization layer is included between the base substrate and the plurality of first connecting leads.

In some embodiments, the display substrate further includes: a plurality of light-emitting devices, located between the first planarization layer and the encapsulation layer; a plurality of third connecting electrodes, disposed in the same layer as the plurality of first connecting leads, where the plurality of third connecting electrodes are electrically connected to the plurality of light-emitting devices in one-to-one correspondence through the via-holes penetrating the first planarization layer; and a plurality of thin-film transistors, located between the base substrate and the second planarization layer, where each thin-film transistor includes a gate disposed in the same layer as the plurality of third connecting leads and a source and a drain that are located between the gate and the second planarization layer; and the plurality of third connecting electrodes are electrically connected to the source or the drain through via-holes penetrating the second planarization layer.

An embodiment of the present disclosure provides a display device. The display device includes the display substrate provided in the foregoing embodiment of the present disclosure.

BRIEF DESCRIPTION OF THE DRAWINGS

To describe the technical solutions of the embodiments of the present disclosure more clearly, the following briefly describes the accompanying drawings required for describing the embodiments. Apparently, the accompanying drawings in the following description show only some embodiments of the present utility model, and a person of ordinary skill in the art may still derive other drawings from these accompanying drawings without creative efforts.

DETAILED DESCRIPTION OF THE EMBODIMENTS

Figure 1:
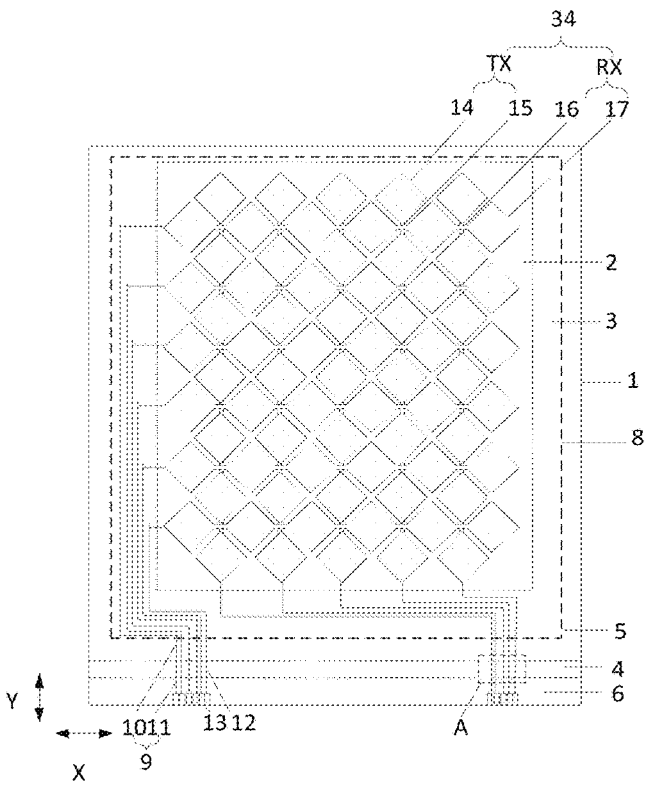
FIG. 1 is a schematic structural diagram of a display substrate according to an embodiment of the present disclosure.

To make the objectives, technical solutions, and advantages of the embodiments of the present disclosure clearer, the following clearly and completely describes the technical solutions in embodiments of the present disclosure with reference to the accompanying drawings in embodiments of the present disclosure. Apparently, the described embodiments are some rather than all of the embodiments of the present disclosure. The embodiments in the present disclosure and the features in the embodiments can be combined with each other without causing a conflict. All other embodiments obtained by persons of ordinary skill in the art based on the described embodiments of the present disclosure without creative efforts shall fall within the protection scope of the present disclosure.

Unless otherwise defined, the technical terms and scientific terms used in the present disclosure have the same meaning as how they are generally understood by those of ordinary skill in the art to which the present disclosure pertains. Terms such as “first” and “second” used in the present disclosure are only used to distinguish different components and do not intend to indicate any order, number or importance. Similar terms such as "comprise" or "include" means that an element or object in front of the term covers elements or objects listed behind the term but do not exclude other elements or objects. Terms such as "connection" or "connected" are not limited to a physical or mechanical connection, and may include an electrical connection, which may be a direct electrical connection or an indirect electrical connection.

It should be noted that the size and shape of the figures in the accompanying drawings do not reflect true scale and are intended to describe the content of the present disclosure only schematically. In addition, the same or similar numerals represent the same or similar elements or elements having the same or similar functions throughout the specification.

In the related art, when a touch function layer is formed on an encapsulation layer, a first buffer layer, a first touch metal layer, a touch insulating layer, and a second touch metal layer usually need to be sequentially formed. If the first buffer layer and the touch insulating layer are both made of an organic material, during patterning of the organic material, only exposure and development are required, and an etching process is not required. When a touch signal trace needs to be lapped to a metal layer of a display panel through an adapter hole penetrating an insulating layer, if a residual inorganic material of the encapsulation layer appears at the adapter hole, the residual inorganic material cannot be removed in a patterning process of the organic material. As a result, the touch signal trace fails to be lapped to the metal layer, making it impossible to transmit a touch signal.

Based on the foregoing problems in the related art, embodiments of the present disclosure provide a display substrate. As shown in FIG. 1, FIG. 2, FIG. 3, and FIG. 4, the display substrate includes:

a base substrate 1, including: a display region 2 and a peripheral region 3 outside the display region 2, where the peripheral region 3 includes at least one bending region 4, a first subregion 5 located between the at least one bending region 4 and the display region 2, and a second subregion 6 located on a side of the at least one bending region 4 away from the display region 2;

a plurality of first connecting leads 7, located on a side of the base substrate 1, where the plurality of first connecting leads 7 extend from the first subregion 5 to the second subregion 6 through the bending region 4;

an encapsulation layer 8, located on a side of the plurality of first connecting leads 7 away from the base substrate 1, where the encapsulation layer 8 covers the display region 2 and extends to the first subregion 5;

a plurality of first touch signal traces 9, located on a side of the encapsulation layer 8 away from the plurality of first connecting leads 7, where the plurality of first touch signal traces 9 and the plurality of first connecting leads 7 are in one-to-one correspondence; each first touch signal trace 9 includes a first sub-touch signal trace 10 located in the first subregion 5 and a second sub-touch signal trace 11 located in the second subregion 6; and one end of each first connecting lead 7 is electrically connected to the first sub-touch signal trace 10, and the other end of the first connecting lead 7 is electrically connected to the second sub-touch signal trace 11; and a plurality of second connecting leads 12, located between the encapsulation layer 8 and the plurality of first touch signal traces 9, or located in the same layer as the plurality of first touch signal traces 9, where the plurality of second connecting leads 12 and the plurality of first connecting leads 7 are in one-to-one correspondence; and the plurality of second connecting leads 12 penetrate the bending region 4, and are electrically connected to the first sub-touch signal trace 10 and the second sub-touch signal trace 11 in one-to-one correspondence.

In the display substrate provided in the embodiments of the present disclosure, the first touch signal traces, the first connecting leads, and the second connecting leads form touch wires for transmitting a touch signal. The second connecting leads are disposed on a side of the encapsulation layer away from the base substrate, and the second connecting leads are electrically connected to the first sub-touch signal trace and the second sub-touch signal trace in one-to-one correspondence, thus, the connection between the second connecting leads and the first sub-touch signal trace and the second sub-touch signal trace is insusceptible to a residual of the encapsulation layer. In addition, even if a material residual of the encapsulation layer exists in a region in which the first sub-touch signal trace and the second sub-touch signal trace are electrically connected to the first connecting leads and as a result the first connecting leads cannot be electrically connected to the first touch signal traces, a touch signal may still be transmitted through the second connecting leads, so that a touch failure can be avoided.

Figure 2:
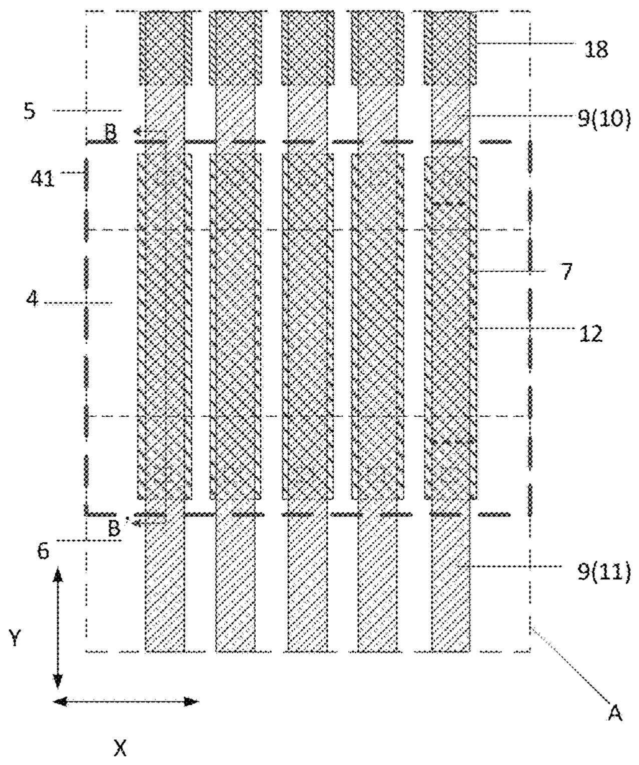
FIG. 2 is an enlarged schematic diagram of a region A in FIG. 1 according to an embodiment of the present disclosure.
Figure 3:
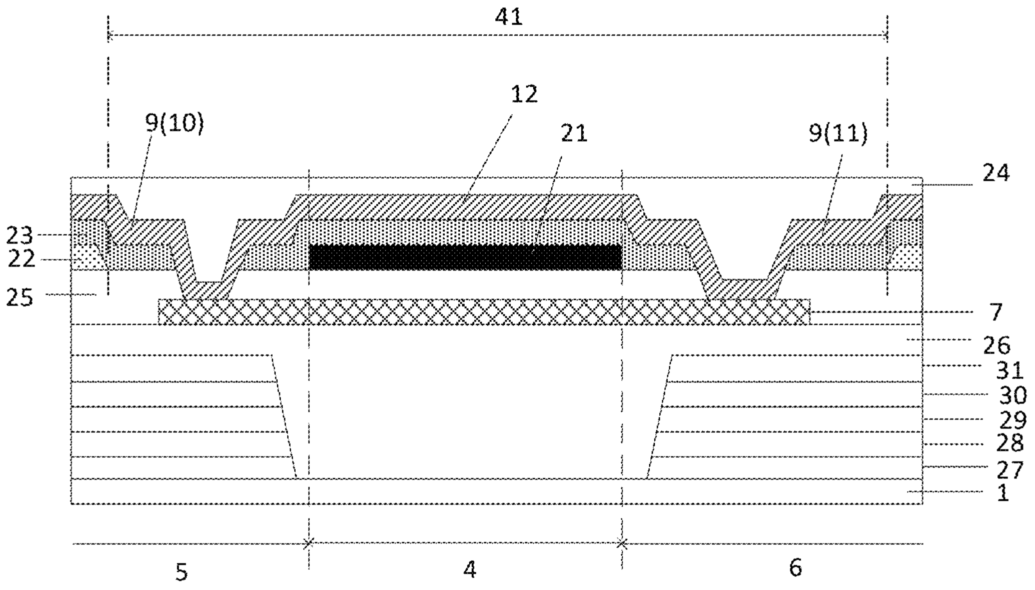
FIG. 3 is a cross-sectional view along BB' in FIG. 2 according to an embodiment of the present disclosure.
Figure 4:
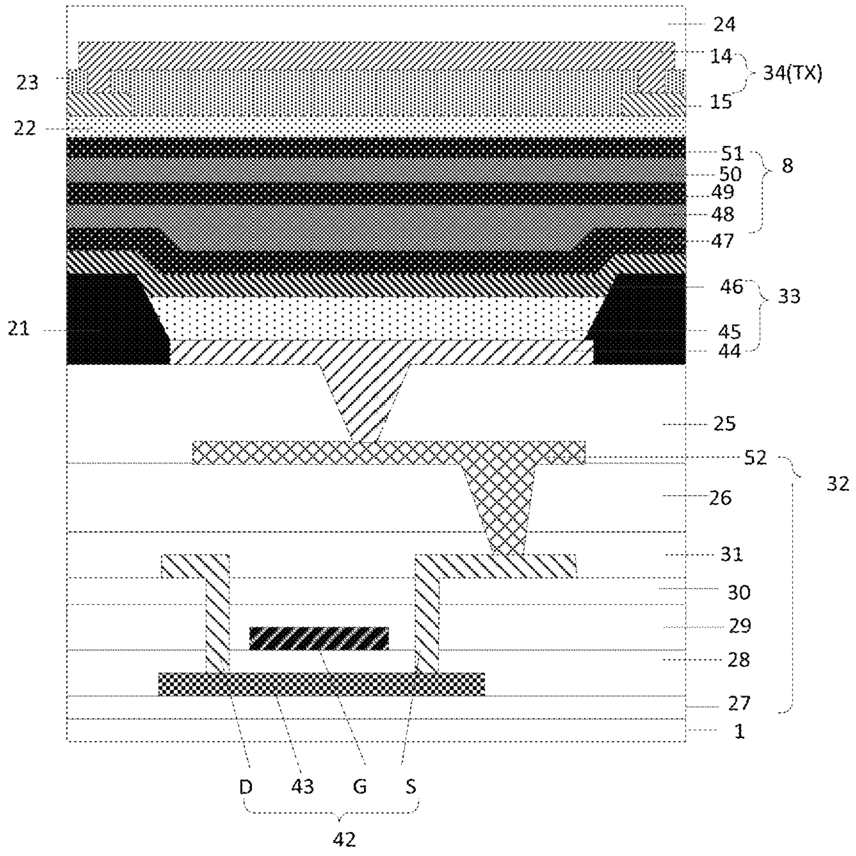
FIG. 4 is a schematic structural diagram of a display region of a display substrate according to an embodiment of the present disclosure.

It should be noted that FIG. 2 is an enlarged schematic diagram of a region A in FIG. 1. FIG. 3 is a cross-sectional view along BB' in FIG. 2. FIG. 4 is a cross-sectional view of the display substrate in a display region. In FIG. 2 and FIG. 3, an example in which the second connecting leads 12 are located in the same layer as the first touch signal traces 9 is used for description. During specific implementation, when the second connecting leads are located in the same layer as the first touch signal traces, the second connecting leads and the first touch signal traces may be integrally connected.

It should be noted that in FIG. 1, an example in which the peripheral region 3 only includes one bending region is used for description, and in FIG. 1 and FIG. 2, an example in which the bending region is in an unbent state is used for description. During specific implementation, the bending region may bend along a bending axis to make the second subregion bend toward the back of the base substrate. The peripheral region may further include more bending regions.

In some embodiments, as shown in FIG. 1, the display region 2 further includes a plurality of touch electrodes 34. As shown in FIG. 4, the touch electrodes 34 are located on a side of the encapsulation layer 8 away from the base substrate 1.

In some embodiments, as shown in FIG. 1, each touch electrode 34 includes a plurality of touch sensing electrodes RX and a plurality of touch driving electrodes TX that intersect with each other. Each touch sensing electrode RX includes: a plurality of touch sensing sub-electrodes 17, and a connecting portion 16 connecting adjacent touch sensing sub-electrodes 17. Each touch driving electrode TX includes: a plurality of touch driving sub-electrodes 14, and a bridge electrode 15 connecting adjacent touch driving sub-electrodes 14. During specific implementation, the touch sensing sub-electrodes 17 are integrally connected to the connecting portions 16, and the touch sensing sub-electrodes 17, the connecting portions 16, and the touch driving sub-electrodes 14 are disposed in the same layer. In some embodiments, as shown in FIG. 4, the bridge electrode 15 is located between the encapsulation layer 8 and the touch driving sub-electrodes 14.

It should be noted that in FIG. 1, an example in which the touch sensing sub-electrodes and the touch driving sub-electrodes are rhombic block electrodes is used for description. During specific implementation, the touch sensing electrodes and the touch driving electrodes may be, for example, mesh electrodes.

In some embodiments, as shown in FIG. 3 and FIG. 4, the display substrate further includes: a first organic insulating layer 23, a second organic insulating layer 24, and a third organic insulating layer 22. The first organic insulating layer 23 is located between the touch driving sub-electrodes 14 and the bridge electrodes 15. The second organic insulating layer 24 is located on sides of the touch driving sub-electrode 14 and the first touch signal traces 9 away from the encapsulation layer 8. The third organic insulating layer 22 is located between the bridge electrodes 15 and the encapsulation layer 8. The touch driving sub-electrodes 14 are electrically connected to the bridge electrodes 15 through via-holes penetrating the first organic insulating layer 23.

In some embodiments, the materials of the first organic insulating layer, the second organic insulating layer, and the third organic insulating layer are photoresist.

In the display substrate provided in the embodiments of the present disclosure, the insulating layer on a side of the encapsulation layer away from the base substrate is an organic insulating layer. When the display substrate is a flexible display substrate and is applied to a curved-surface bending product, the arrangement of the organic insulating layer can satisfy a stress requirement of large-angle bending, thereby avoiding defects such as bending or fracturing.

In some embodiments, the first touch signal traces are disposed in the same layer as the touch sensing sub-electrodes, the connecting portions, and the touch driving sub-electrodes.

During specific implementation, in the embodiments of the present disclosure, Flexible Multi Layer On Cell (FMLOC) is adopted to form touch function layers such as the organic insulating layer, the touch electrodes, the first touch signal traces, and the second connecting leads on the encapsulation layer.

In some embodiments, in FIG. 1, the touch sensing electrodes RX extend in a first direction X. The touch driving electrodes TX extend in a second direction Y The first direction X and the second direction Y intersect with each other. For example, the first direction X is perpendicular to the second direction Y Certainly, during specific implementation, the positions of the touch sensing electrodes RX and the touch driving electrodes TX are interchangeable.

During specific implementation, as shown in FIG. 1, the touch sensing electrodes RX and the touch driving electrodes TX are electrically connected to the first touch signal traces 9. In FIG. 1, part of the first sub-touch signal trace 10 located in the first subregion 5 extends to the remaining peripheral region to be electrically connected to the touch sensing electrodes RX extending in the first direction X. Part of the first sub-touch signal trace 10 located in the first subregion 5 extends to the display region to be electrically connected to the touch driving electrode TX extending in the second direction Y.

During specific implementation, the first touch signal traces, the first connecting leads, and the second connecting leads form the touch wires for transmitting a touch signal. a driving signal may be provided to a corresponding touch electrode through the touch wires, or a sensing signal on a corresponding touch electrode may be received through the touch wires. That is, a touch wire electrically connected to a touch sensing electrode RX receives a sensing signal on a corresponding touch sensing electrode RX, and a touch wire electrically connected to a touch driving electrode TX is used to provide a driving signal to a corresponding touch driving electrode TX.

During specific implementation, as shown in FIG. 1, in the second subregion 6, the display substrate further includes a bonding terminal 13 electrically connected to the first touch signal traces 9.

During specific implementation, the bonding terminal may be, for example, bonded to a driving unit such as a flexible circuit board, so that the driving unit such as the flexible circuit board may provide a driving signal and receive a sensing signal.

In some embodiments, as shown in FIG. 5, FIG. 6, FIG. 7, FIG. 8, FIG. 9, and FIG. 10, the display substrate further includes: a plurality of first adapter electrodes 35 and a plurality of second adapter electrodes 36 located between the first touch signal traces 9 and the encapsulation layer. The first adapter electrodes 35 are located in the first subregion 5, and the second adapter electrodes 36 are located in the second subregion 6.

Figure 5:
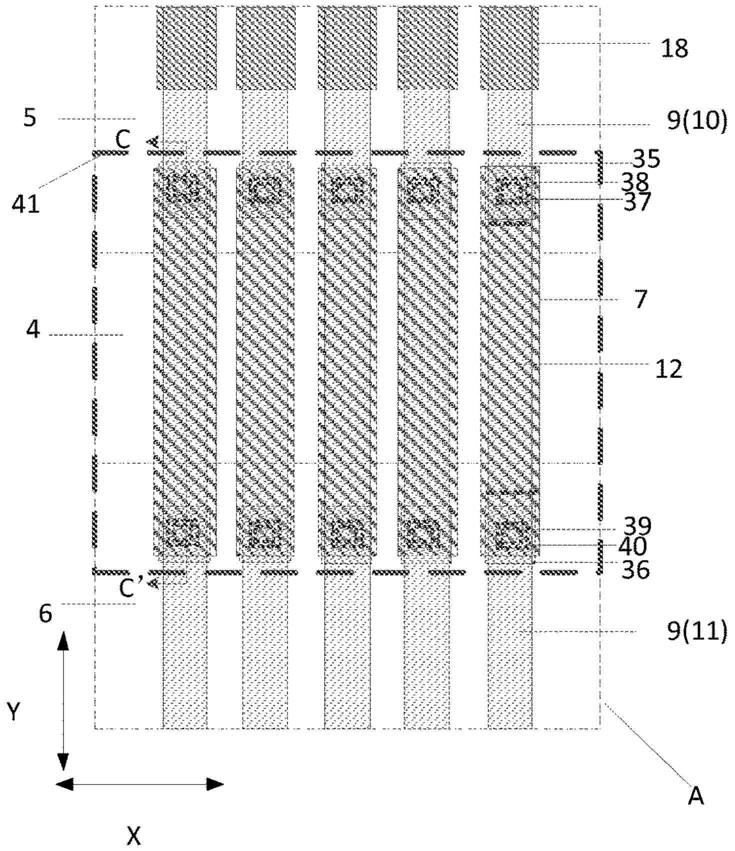
FIG. 5 is another enlarged schematic diagram of a region A in FIG. 1 according to an embodiment of the present disclosure.
Figure 6:
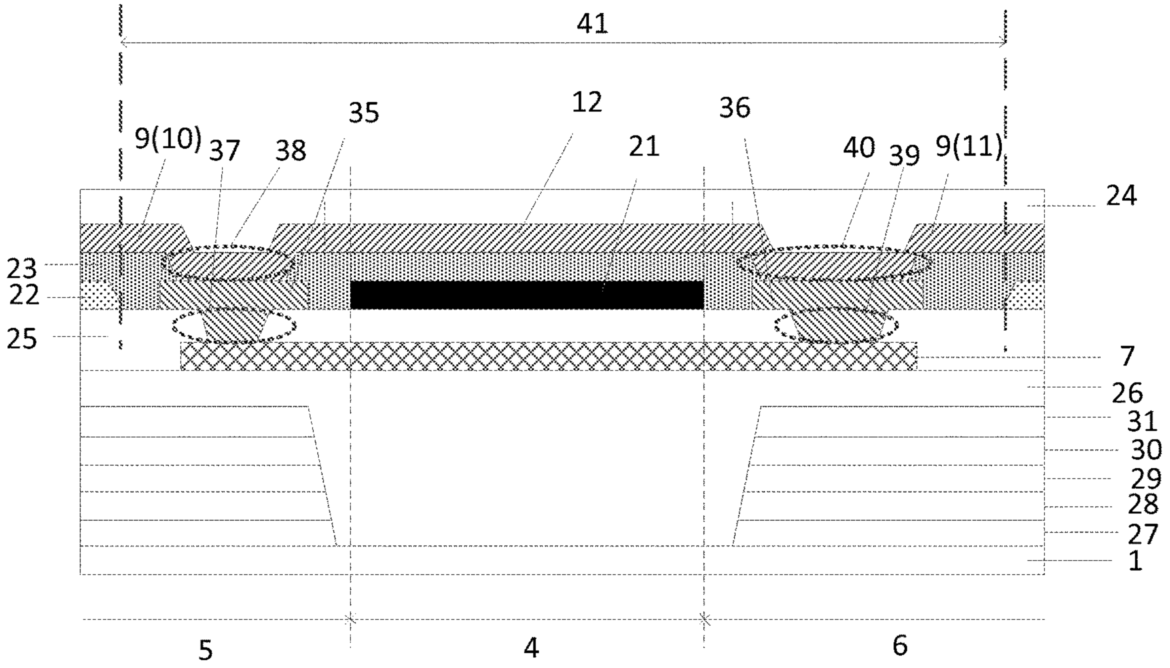
FIG. 6 is a cross-sectional view along CC' in FIG. 5 according to an embodiment of the present disclosure.
Figure 7:
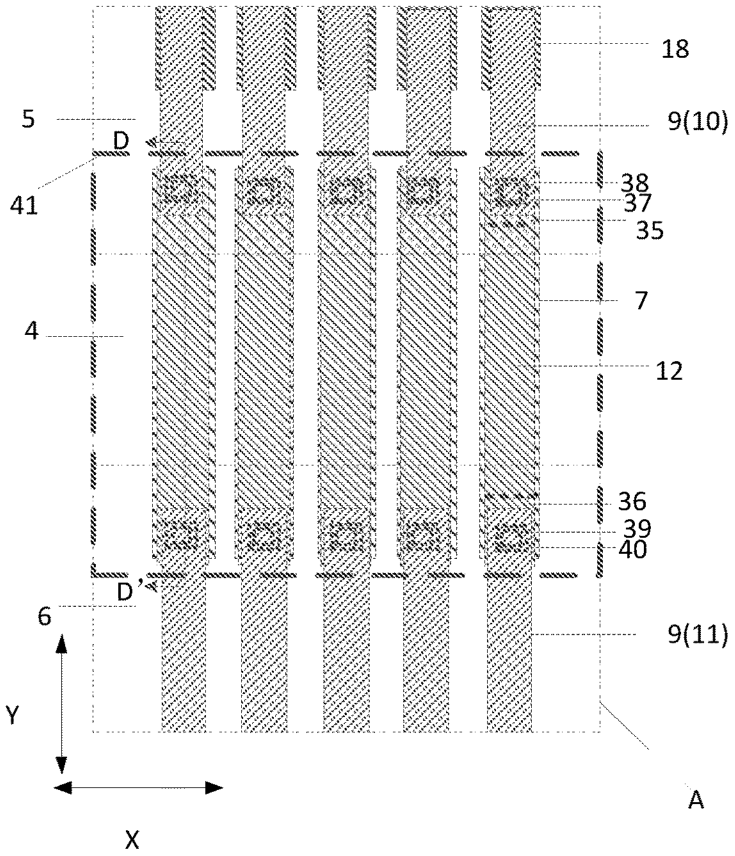
FIG. 7 is still another enlarged schematic diagram of a region A in FIG. 1 according to an embodiment of the present disclosure.
Figure 8:
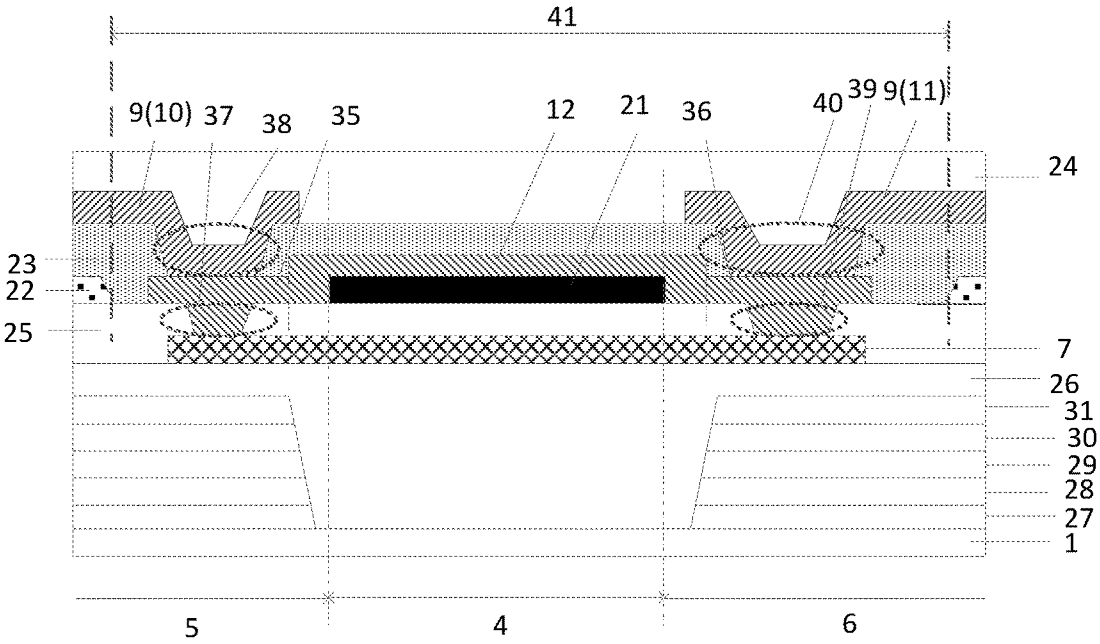
FIG. 8 is a cross-sectional view along DD' in FIG. 7 according to an embodiment of the present disclosure.
Figure 9:
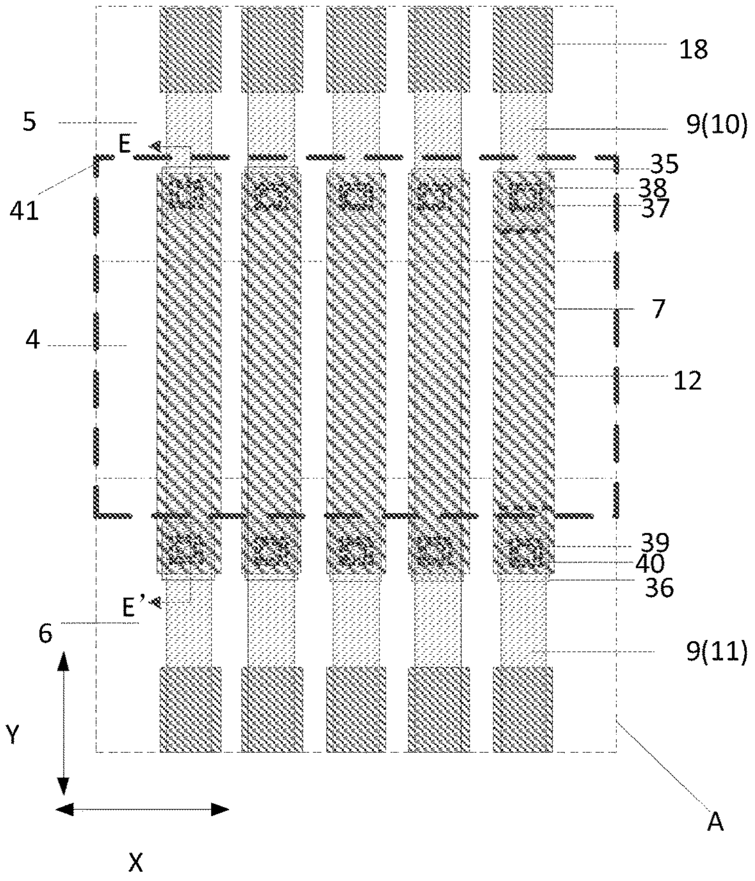
FIG. 9 is still another enlarged schematic diagram of a region A in FIG. 1 according to an embodiment of the present disclosure.
Figure 10:
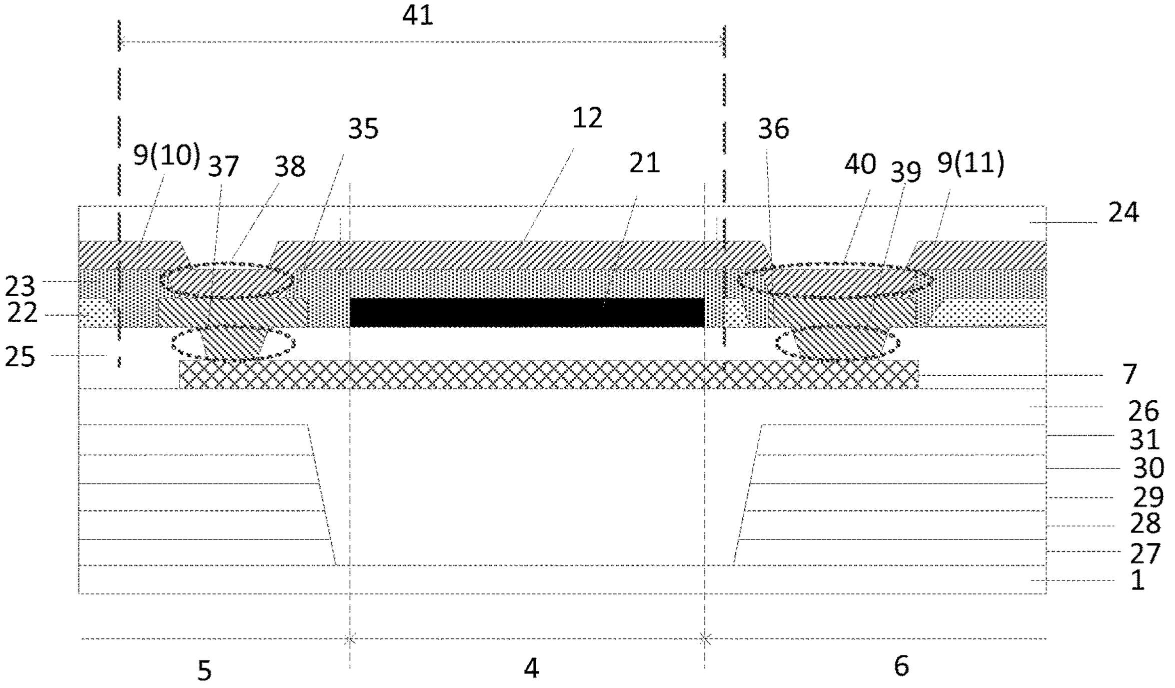
FIG. 10 is a cross-sectional view along EE' in FIG. 9 according to an embodiment of the present disclosure.

It should be noted that, FIG. 5 is another enlarged schematic diagram of the region A in FIG. 1. FIG. 6 is a cross-sectional view along CC' in FIG. 5. FIG. 7 is still another enlarged schematic diagram of the region A in FIG. 1. FIG. 8 is a cross-sectional view along DD' in FIG. 7. FIG. 9 is still another enlarged schematic diagram of the region A in FIG. 1. FIG. 10 is a cross-sectional view along EE' in FIG. 9.

In some embodiments, the first adapter electrodes and the second adapter electrodes are disposed in the same layer as the bridge electrodes. That is, the third organic insulating layer is located between the first adapter electrodes and the encapsulation layer. The first organic insulating layer extends to the peripheral region and is located between the first touch signal traces and the first adapter electrodes.

In some embodiments, as shown in FIG. 6, FIG. 8, and FIG. 10, the first sub-touch signal trace 10 is electrically connected to the plurality of first adapter electrodes 35 through via-holes 38 penetrating the first organic insulating layer 23, and the second sub-touch signal trace 11 is electrically connected to the plurality of second adapter electrodes 36 through via-holes 40 penetrating the first organic insulating layer 23.

In some embodiments, as shown in FIG. 6, FIG. 8, FIG. 10, the display substrate further includes: a first planarization layer 25 located between the plurality of first connecting leads 7 and the encapsulation layer; and the plurality of first adapter electrodes 35 and the plurality of second adapter electrodes 36 are respectively electrically connected to the two ends of the first connecting leads 7 through via-holes penetrating the first planarization layer 25. During specific implementation, as shown in FIG. 6 and FIG. 8, the first adapter electrodes 35 are electrically connected to the first connecting leads 7 through via-holes 37 penetrating the first planarization layer 25 in the first subregion 5. The second adapter electrodes 36 are electrically connected to the first connecting leads 7 through via-holes 39 penetrating the first planarization layer 25 in the second subregion 6.

It should be noted that, the first connecting leads need to be electrically connected to the first touch signal traces. Therefore, via-holes penetrating the first planarization layer need to be formed in the first subregion and the second subregion to expose the first connecting leads. When no protection is arranged for the first connecting leads exposed by the via-holes, in a patterning process of the bridge electrodes, if overetching occurs, damage is caused to the first connecting leads in the regions of the via-holes.

In the display substrate provided in the embodiments of the present disclosure, a first connecting electrode and a second connecting electrode in contact with the first connecting leads are disposed in the regions of the first connecting leads exposed by the via-holes in the first planarization layer. The first connecting electrode and the second connecting electrode cover the first connecting leads in the regions of the via-holes, to prevent damage caused by overetching to the first connecting leads in the patterning process. In addition, the first connecting leads and the first touch signal traces may further be electrically connected by the first connecting electrode and the second connecting electrode.

In some embodiments, as shown in FIG. 5, FIG. 6, FIG. 9, and FIG. 10, the plurality of second connecting leads 12 are disposed in the same layer as and integrally connected to the plurality of first touch signal traces 9.

In some embodiments, as shown in FIG. 6 and FIG. 10, the second organic insulating layer 24 covers the second connecting leads 12, so that the second organic insulating layer can protect the second connecting leads.

Alternatively, in some embodiments, as shown in FIG. 7 and FIG. 8, the plurality of second connecting leads 12 are disposed in the same layer as and integrally connected to the plurality of first adapter electrodes 35 and the plurality of second adapter electrodes 36.

In some embodiments, as shown in FIG. 8, the first organic insulating layer 23 covers the second connecting leads 12, so that the first organic insulating layer can protect the second connecting leads.

In some embodiments, as shown in FIG. 2, FIG. 5, FIG. 7, and FIG. 9, the display substrate further includes: second touch signal traces 18 that are in one-to-one correspondence with and electrically connected to the first touch signal traces 9. In this way, a trace width of the touch signal trace can be reduced while the resistance of the touch signal trace satisfies a requirement, thereby saving wiring space.

During specific implementation, the second touch signal traces are disposed in the same layer as the bridge electrodes. When the display substrate includes the first adapter electrodes and the second adapter electrodes, the second touch signal trace are disposed in the same layer as the bridge electrodes, the first adapter electrodes, and the second adapter electrodes. Orthographic projections of the second touch signal traces onto the base substrate and orthographic projections of the first touch signal traces onto the base substrate are overlapped. The first touch signal traces are electrically connected to the second touch signal traces through via-holes penetrating the first organic insulating layer.

It should be noted that to clearly show orthographic projection relationships among the first touch signal traces, the second touch signal traces, and the first connecting leads, an example in which the first touch signal traces, the second touch signal traces, the first connecting leads, and the second connecting leads do not have identical trace widths is used in FIG. 2, FIG. 5, FIG. 7, FIG. 9 for description. During specific implementation, the trace widths of the first touch signal traces, the second touch signal traces, the first connecting leads, and the second connecting leads may be set as required. The trace widths of the foregoing signal traces may be identical, partially the same, or identical.

In some embodiments, as shown in FIG. 2, FIG. 3, and FIG. 5 to FIG. 8, in the peripheral region, the third organic insulating layer 22 includes a first removal region 41.

An orthographic projection of the first removal region 41 onto the base substrate 1 covers orthographic projections of the bending region 4 and the plurality of first adapter electrodes 35 and the plurality of second adapter electrodes 36 onto the base substrate 1.

A distance between an edge of the first removal region 41 in the first subregion 5 and the plurality of first adapter electrodes 35 is greater than 0, and a distance between an edge of the first removal region 41 in the second subregion 6 and the plurality of second adapter electrodes 36 is greater than 0.

It should be noted that, after the patterning process is performed on the third organic insulating layer, an edge of the third organic insulating layer usually has a rough inclined surface. After the patterning process is performed on the first adapter electrodes, the second adapter electrodes, and the bridge electrodes, a residual of a conductor material is easily caused on an inclined surface of an edge of a region in which most of the third organic insulating layer is removed.

In the display substrate provided in the embodiments of the present disclosure, distances between an edge of the first removal region and the first adapter electrodes and the second adapter electrodes are both greater than 0. That is, the edge of the first removal region is not in contact with the first adapter electrodes and the second adapter electrodes, so that a residual of a conductor material can be prevented from appearing on the inclined surface of the edge of the first removal region, thereby avoiding short circuits between the first adapter electrodes and short circuits between the plurality of the second adapter electrodes.

Alternatively, in some embodiments, as shown in FIG. 9 and FIG. 10, an orthographic projection of the first removal region onto the base substrate covers orthographic projections of the bending region and the plurality of first adapter electrodes onto the base substrate; and the orthographic projection of the first removal region onto the base substrate and orthographic projections of the plurality of second adapter electrodes onto the base substrate are not overlapped with each other.

A distance between an edge of the first removal region in the first subregion and the plurality of first adapter electrodes is greater than 0, and a distance between an edge of the first removal region in the second subregion and the plurality of second adapter electrodes is greater than 0.

That is, the edge of the first removal region in the first subregion is located on a side of the first adapter electrode close to the display region. The edge of the first removal region in the second subregion is located between the bending region and the second adapter electrodes.

In the display substrate provided in the embodiments of the present disclosure, the edge of the first removal region in the first subregion is located on the side of the first adapter electrode close to the display region. The edge of the first removal region in the second subregion is located between the bending region and the second adapter electrodes. It can still be satisfied that the distances between the edge of the first removal region and the first adapter electrodes and the second adapter electrodes are both greater than 0. That is, the edge of the first removal region is in contact with neither of the first adapter electrodes and the second adapter electrodes, so that a residual of a conductor material can be prevented from appearing on the inclined surface of the edge of the first removal region, thereby avoiding short circuits between the first adapter electrodes and short circuits between the plurality of the second adapter electrodes.

It should be noted that, as shown in FIG. 2, FIG. 5, and FIG. 7, in the second subregion 6, the first removal region 41 is located on a side of the second adapter electrode 36 away from the bending region 4. That is, the third organic insulating layer on the side of the second adapter electrode 36 away from the bending region 4 has an edge with the entire surface removed. Therefore, to prevent a residual of a conductor material from appearing on an inclined surface of an edge of a region in which most of the third organic insulating layer is removed to avoid short circuits between the second touch signal traces, the second touch signal traces 18 are only located in the first subregion 5.

In the display substrate shown in FIG. 9 provided in the embodiments of the present disclosure, the edge of the first removal region in the second subregion is located between the bending region and the second adapter electrodes. In the second subregion and the region in which the second adapter electrodes are connected to the first connecting leads, a plurality of via-holes are provided in the third organic insulating layer to implement the adaptation of the second adapter electrodes and the first connecting leads. On the side of the second adapter electrodes away from the bending region, the third organic insulating layer does not have an edge with an entire surface removed. Therefore, as shown in FIG. 9, the second touch signal traces 18 may still be disposed in the second subregion 6, thereby saving wiring space.

In some embodiments, as shown in FIG. 3, FIG. 6, FIG. 8, and FIG. 10, the first organic insulating layer 23 covers an edge of the first removal region 41.

In the display substrate provided in the embodiments of the present disclosure, the first organic insulating layer covers the edge of the first removal region. That is, the first organic insulating layer covers the region between the third organic insulating layer and the first adapter electrodes and the region between the third organic insulating layer and the second adapter electrodes, to further ensure that the edge of the first removal region is in contact with neither of the first adapter electrodes and the second adapter electrodes, so that a residual of a conductor material is prevented from appearing on the inclined surface of the edge of the removal region, thereby avoiding short circuits between the first adapter electrodes and short circuits between the plurality of the second adapter electrodes.

In some embodiments, the encapsulation layer includes an inorganic encapsulation layer and an organic encapsulation layer that are alternately stacked; the inorganic encapsulation layer covers the display region and extends to cover the first subregion; and an edge of the inorganic encapsulation layer in the first subregion is located on a side of the edge of the first removal region in the first subregion close to the display region.

In some embodiments, as shown in FIG. 4, the encapsulation layer 8 specifically includes: a first inorganic encapsulation layer 47, a first organic encapsulation layer 48, a second inorganic encapsulation layer 49, a second organic encapsulation layer 50, and a third inorganic encapsulation layer 51 that are stacked.

In the display substrate provided in the embodiments of the present disclosure, three inorganic encapsulation layers and two organic encapsulation layers are alternately disposed. Compared with a case in which only three encapsulation layers are disposed in a conventional display product, a stress requirement of large-angle bending can be satisfied, thereby avoiding defects such as bending or fracturing.

During specific implementation, the edges of the first inorganic encapsulation layer, the second inorganic encapsulation layer, and the third inorganic encapsulation layer in the first subregion are all located on the side of the edge of the first removal region in the first subregion close to the display region.

In some embodiments, as shown in FIG. 4, the display substrate specifically includes: a driving circuit layer 32 located between the base substrate 1 and the encapsulation layer 8, and a plurality of light-emitting devices 33 located between the driving circuit layer 32 and the encapsulation layer 8.

During specific implementation, as shown in FIG. 4, the light-emitting devices 33 are located between the first planarization layer 25 and the encapsulation layer 8.

In some embodiments, the driving circuit layer includes a plurality of pixel driving circuits arranged in arrays. The pixel driving circuits are used to drive the light-emitting device to emit light. As shown in FIG. 4, each pixel driving circuit includes, for example, a thin-film transistor 42 and a storage capacitor (not shown).

In some embodiments, as shown in FIG. 4, the thin-film transistor 42 includes: an active layer 43, a gate G located between the active layer 43 and the first planarization layer 25, and a source S and a drain D that are located between the gate G and the first planarization layer 25. The display substrate further includes: a first buffer layer 27 located between the base substrate 1 and the active layer 43; a first gate insulating layer 28 located between the active layer 43 and the gate G, a second gate insulating layer 29 located between the first gate insulating layer 28 and the source S, an inter-layer insulating layer 30 located between the second gate insulating layer 29 and the source S, a passivation layer 31 located between the source S and the first planarization layer 25, a plurality of third connecting electrodes 52 located between the passivation layer 31 and the first planarization layer 25, a second planarization layer 26 located between the third connecting electrodes 52 and the first planarization layer 25, and a pixel defining layer 21 located between the first planarization layer 25 and the encapsulation layer 8. The display substrate further includes: a first electrode of the storage capacitor located between the first gate insulating layer and the second gate insulating layer; and a second electrode of the storage capacitor is disposed in the same layer as the gate G.

During specific implementation, as shown in FIG. 4, the plurality of third connecting electrodes 52 are electrically connected to the plurality of light-emitting devices 33 in one-to-one correspondence through the via-holes penetrating the first planarization layer 25.

During specific implementation, as shown in FIG. 4, the thin-film transistors 42 are located between the base substrate 1 and the second planarization layer 26. The third connecting electrodes are electrically connected to the sources or drains of the thin-film transistors 42 through the via-holes penetrating the second planarization layer 26 and the passivation layer 31. In FIG. 4, an example in which the third connecting electrodes 52 are electrically connected to the sources S of the thin-film transistors through the via-holes penetrating the second planarization layer 26 and the passivation layer 31 is used for description.

In some embodiments, as shown in FIG. 4, the light-emitting device 33 includes an anode 44, a light-emitting function layer 45, and a cathode 46 that are stacked. The third connecting electrodes 52 are electrically connected to the anodes 44 through the via-holes penetrating the first planarization layer 25.

During specific implementation, the light-emitting device is, for example, an organic light-emitting diode device or a quantum dot light-emitting diode device.

During specific implementation, in the display region, the pixel defining layer has a plurality of opening regions that are in one-to-one correspondence to the light-emitting devices. The light-emitting devices are located in the opening regions.

During specific implementation, the display substrate further includes a barrier wall surrounding the display region. The barrier wall is, for example, formed by stacking a part disposed in the same layer as the pixel defining layer and a part disposed in the same layer as the first planarization layer. The barrier wall is used to block the organic encapsulation layer. At least the first inorganic encapsulation layer covers the barrier wall. In the first subregion, an edge of the first inorganic insulating layer is located between the barrier wall and the edge of the first removal region.

In some embodiments, the first connecting leads are disposed in the same layer as the third connecting electrodes.

In some embodiments, as shown in FIG. 3, FIG. 6, FIG. 8, and FIG. 10, in the bending region 4, only the second planarization layer 26 is arranged between the base substrate 1 and the first connecting leads 7, so that a quantity of insulating film layers in the bending region can be reduced, to avoid the risk that film layers are stripped and fall off during bending of the bending region when a quantity of film layers is large.

Certainly, during specific implementation, the first connecting leads may be disposed in the same layer as the sources and the drains. Alternatively, the first connecting leads are disposed in the same layer as the gates.

Figure 11:
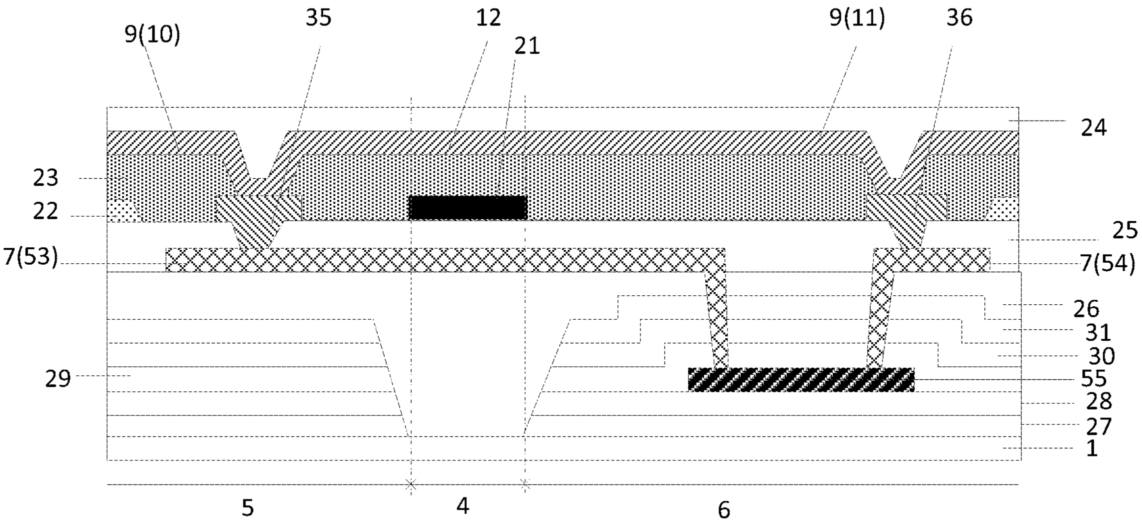
FIG. 11 is a schematic structural diagram of another display substrate according to an embodiment of the present disclosure.

In some embodiments, as shown in FIG. 11, the first connecting lead 7 includes: a first sub-connecting lead 53 and a second sub-connecting lead 54.

The display substrate further includes: a plurality of third connecting leads 55, located between the base substrate 1 and the plurality of first connecting leads 7, and are in one-to-one correspondence with the plurality of first connecting leads 7; and one end of each third connecting lead 55 is electrically connected to the first sub-connecting lead 53, and the other end of the third connecting lead 55 is electrically connected to the second sub-connecting lead 54.

In the display substrate provided in the embodiments of the present disclosure, the third connecting leads are disposed to implement adaptation between the first sub-connecting leads and the second sub-connecting leads, thereby avoiding a case that a large amount of static electricity is generated when only one type of signal traces is disposed and affects the transmission of a touch signal.

It should be noted that, in FIG. 11, an example in which the display substrate includes the first adapter electrodes and the second adapter electrodes and second connecting leads and are disposed in the same layer as the first touch signal traces is used for description.

In some embodiments, as shown in FIG. 11, the plurality of third connecting leads 55 are located in the second subregion 6.

In some embodiments, the third connecting leads are disposed in the same layer as the gates of the thin-film transistors.

In some embodiments, the base substrate is a flexible base substrate. The material of the flexible base substrate is, for example, polyimide.

During specific implementation, the base substrate may, for example, include a single flexible base substrate. Alternatively, the base substrate may include two flexible base substrates and a second buffer layer located between the two flexible base substrates.

An embodiment of the present disclosure provides a display device. The display device includes the display substrate provided in the foregoing embodiment of the present disclosure.

The display apparatus provided in the embodiments of the present disclosure is a mobile phone, a tablet computer, a television, a display, a notebook computer, a digital frame, a navigator or any other product or component having a display function. Other essential components of the display device should be understood by a person of ordinary skill in the art, and details are not described again herein, nor should they be used as a limitation of the present disclosure. The implementation of the display device can be seen in the above embodiment of the display substrate, and details are not described again.

In summary, in the display substrate and the display device provided in the embodiments of the present disclosure, the first touch signal traces, the first connecting leads, and the second connecting leads form touch wires for transmitting a touch signal. The second connecting leads are disposed on a side of the encapsulation layer away from the base substrate. The second connecting leads are electrically connected to the first sub-touch signal trace and the second sub-touch signal trace in one-to-one correspondence. Therefore, the connection between the second connecting leads and the first sub-touch signal trace and the second sub-touch signal trace is insusceptible to a residual of the encapsulation layer. In addition, even if a material residual of the encapsulation layer exists in a region in which the first sub-touch signal trace and the second sub-touch signal trace are electrically connected to the first connecting leads and as a result the first connecting leads cannot be electrically connected to the first touch signal traces, a touch signal may still be transmitted through the second connecting leads, so that a touch failure can be avoided.

Although preferred embodiments of the present invention are described, once acquiring basic innovative concepts, a person skilled in the art may make other changes and modifications to these embodiments. Therefore, the appended claims intend to be explained to include preferred embodiments and all changes and modifications that fall within the scope of the present invention.

Obviously, persons skilled in the art can make various modifications and variations to the embodiments of the present invention without departing from the spirit and scope of the embodiments of the present invention. In this way, if these modifications and variations to the embodiments of the present invention fall within the scope of claims of the present invention and equivalent technologies thereof, the present invention also intends to cover these modifications and variations.

The invention claimed is:

1. A display substrate, comprising:

a base substrate, comprising: a display region and a peripheral region outside the display region, wherein the peripheral region comprises at least one bending region, a first subregion located between the at least one bending region and the display region, and a second subregion located on a side of the at least one bending region away from the display region;

a plurality of first connecting leads, located on a side of the base substrate, wherein the plurality of first connecting leads extend from the first subregion to the second subregion through the bending region;

an encapsulation layer, located on a side of the plurality of first connecting leads away from the base substrate, wherein the encapsulation layer covers the display region and extends to the first subregion;

a plurality of first touch signal traces, located on a side of the encapsulation layer away from the plurality of first connecting leads, wherein the plurality of first touch signal traces and the plurality of first connecting leads are in one-to-one correspondence; each first touch signal trace comprises a first sub-touch signal trace located in the first subregion and a second sub-touch signal trace located in the second subregion; and one end of each first connecting lead is electrically connected to the first sub-touch signal trace, and the other end of the first connecting lead is electrically connected to the second sub-touch signal trace;

a plurality of second connecting leads, located between the encapsulation layer and the plurality of first touch signal traces, or located in the same layer as the plurality of first touch signal traces, wherein the plurality of second connecting leads and the plurality of first connecting leads are in one-to-one correspondence; and the plurality of second connecting leads pass through the bending region, and are electrically connected to the first sub-touch signal trace and the second sub-touch signal trace in one-to-one correspondence; and a plurality of first adapter electrodes and a plurality of second adapter electrodes located between the plurality of first touch signal traces and the encapsulation layer, a first organic insulating layer located between the plurality of first touch signal traces and the plurality of first adapter electrodes, and a first planarization layer located between the plurality of first connecting leads and the encapsulation layer;

wherein the plurality of first adapter electrodes are located in the first subregion, and the plurality of second adapter electrodes are located in the second subregion;

the first sub-touch signal trace is electrically connected to the plurality of first adapter electrodes through via-holes penetrating the first organic insulating layer, and the second sub-touch signal trace is electrically connected to the plurality of second adapter electrodes through via-holes penetrating the first organic insulating layer; and the plurality of first adapter electrodes and the plurality of second adapter electrodes are respectively electrically connected to the two ends of the first connecting lead through via-holes penetrating the first planarization layer.

2. The display substrate according to claim 1, wherein the plurality of second connecting leads are disposed in the same layer as the plurality of first touch signal traces, and the plurality of second connecting leads are integrally connected to the plurality of first touch signal traces.

3. The display substrate according to claim 2, further comprising:

a second organic insulating layer, located on a side of the first touch signal trace away from the encapsulation layer, wherein the second organic insulating layer covers the plurality of second connecting leads.

4. The display substrate according to claim 1, wherein the plurality of second connecting leads are disposed in the same layer as the plurality of first adapter electrodes and the plurality of second adapter electrodes, and the plurality of second connecting leads are integrally connected to the plurality of first adapter electrodes and the plurality of second adapter electrodes.

5. The display substrate according to claim 4, wherein the first organic insulating layer covers the plurality of second connecting leads.

6. The display substrate according to claim 1, further comprising:

a third organic insulating layer, located between the plurality of first adapter electrodes and the encapsulation layer;

wherein in the peripheral region, the third organic insulating layer comprises a first removal region;

an orthographic projection of the first removal region onto the base substrate covers orthographic projections of the bending region, the plurality of first adapter electrodes and the plurality of second adapter electrodes onto the base substrate; and a distance between an edge of the first removal region in the first subregion and the plurality of first adapter electrodes is greater than 0, and a distance between an edge of the first removal region in the second subregion and the plurality of second adapter electrodes is greater than 0.

7. The display substrate according to claim 1, further comprising:

a third organic insulating layer, located between the plurality of first adapter electrodes and the encapsulation layer;

wherein in the peripheral region, the third organic insulating layer comprises a first removal region;

an orthographic projection of the first removal region onto the base substrate covers orthographic projections of the bending region and the plurality of first adapter electrodes onto the base substrate; and the orthographic projection of the first removal region onto the base substrate and orthographic projections of the plurality of second adapter electrodes onto the base substrate are not overlapped with each other; and a distance between an edge of the first removal region in the first subregion and the plurality of first adapter electrodes is greater than 0, and a distance between an edge of the first removal region in the second subregion and the plurality of second adapter electrodes is greater than 0.

8. The display substrate according to claim 7, wherein the first organic insulating layer covers the edges of the first removal region.

9. The display substrate according to claim 7, wherein the encapsulation layer comprises an inorganic encapsulation layer and an organic encapsulation layer that are alternately stacked; the inorganic encapsulation layer covers the display region and extends to cover the first subregion; and an edge of the inorganic encapsulation layer in the first subregion is located on a side of the edge of the first removal region in the first subregion close to the display region.

10. The display substrate according to claim 9, wherein the encapsulation layer further comprises: a first inorganic encapsulation layer, a first organic encapsulation layer, a second inorganic encapsulation layer, a second organic encapsulation layer, and a third inorganic encapsulation layer that are stacked.

11. The display substrate according to claim 1, wherein the first connecting lead comprises: a first sub-connecting lead and a second sub-connecting lead; and the display substrate further comprises:

a plurality of third connecting leads, located between the base substrate and the plurality of first connecting leads, and being in one-to-one correspondence with the plurality of first connecting leads; wherein one end of the third connecting lead is electrically connected to the first sub-connecting lead, and the other end of the third connecting lead is electrically connected to the second sub-connecting lead.

12. The display substrate according to claim 11, wherein the plurality of third connecting leads are located in the second subregion.

13. The display substrate according to claim 11, further comprising:

a second planarization layer, located between the plurality of first connecting leads and the plurality of third connecting leads, wherein in the bending region, only the second planarization layer is comprised between the base substrate and the plurality of first connecting leads.

14. The display substrate according to claim 13, further comprising:

a plurality of light-emitting devices, located between the first planarization layer and the encapsulation layer;

a plurality of third connecting electrodes, disposed in the same layer as the plurality of first connecting leads, wherein the plurality of third connecting electrodes are electrically connected to the plurality of light-emitting devices in one-to-one correspondence through the via-holes penetrating the first planarization layer; and a plurality of thin-film transistors, located between the base substrate and the second planarization layer, wherein each thin-film transistor comprises a gate disposed in the same layer as the plurality of third connecting leads and a source and a drain that are located between the gate and the second planarization layer; and the plurality of third connecting electrodes are electrically connected to the source or the drain through via-holes penetrating the second planarization layer.

15. A display device, comprising a display substrate, wherein the display substrate comprises:

a base substrate, comprising: a display region and a peripheral region outside the display region, wherein the peripheral region comprises at least one bending region, a first subregion located between the at least one bending region and the display region, and a second subregion located on a side of the at least one bending region away from the display region;

a plurality of first connecting leads, located on a side of the base substrate, wherein the plurality of first connecting leads extend from the first subregion to the second subregion through the bending region;

an encapsulation layer, located on a side of the plurality of first connecting leads away from the base substrate, wherein the encapsulation layer covers the display region and extends to the first subregion;

a plurality of first touch signal traces, located on a side of the encapsulation layer away from the plurality of first connecting leads, wherein the plurality of first touch signal traces and the plurality of first connecting leads are in one-to-one correspondence; each first touch signal trace comprises a first sub-touch signal trace located in the first subregion and a second sub-touch signal trace located in the second subregion; and one end of each first connecting lead is electrically connected to the first sub-touch signal trace, and the other end of the first connecting lead is electrically connected to the second sub-touch signal trace;

a plurality of second connecting leads, located between the encapsulation layer and the plurality of first touch signal traces, or located in the same layer as the plurality of first touch signal traces, wherein the plurality of second connecting leads and the plurality of first connecting leads are in one-to-one correspondence; and the plurality of second connecting leads pass through the bending region, and are electrically connected to the first sub-touch signal trace and the second sub-touch signal trace in one-to-one correspondence; and a plurality of first adapter electrodes and a plurality of second adapter electrodes located between the plurality of first touch signal traces and the encapsulation layer, a first organic insulating layer located between the plurality of first touch signal traces and the plurality of first adapter electrodes, and a first planarization layer located between the plurality of first connecting leads and the encapsulation layer;

wherein the plurality of first adapter electrodes are located in the first subregion, and the plurality of second adapter electrodes are located in the second subregion;

the first sub-touch signal trace is electrically connected to the plurality of first adapter electrodes through via-holes penetrating the first organic insulating layer, and the second sub-touch signal trace is electrically connected to the plurality of second adapter electrodes through via-holes penetrating the first organic insulating layer; and the plurality of first adapter electrodes and the plurality of second adapter electrodes are respectively electrically connected to the two ends of the first connecting lead through via-holes penetrating the first planarization layer.

16. The display device according to claim 15, wherein the plurality of second connecting leads are disposed in the same layer as the plurality of first touch signal traces, and the plurality of second connecting leads are integrally connected to the plurality of first touch signal traces.

17. The display device according to claim 16, wherein the display substrate further comprises:

a second organic insulating layer, located on a side of the first touch signal trace away from the encapsulation layer, wherein the second organic insulating layer covers the plurality of second connecting leads.

18. The display device according to claim 15, wherein the plurality of second connecting leads are disposed in the same layer as the plurality of first adapter electrodes and the plurality of second adapter electrodes, and the plurality of second connecting leads are integrally connected to the plurality of first adapter electrodes and the plurality of second adapter electrodes.

19. A display substrate, comprising:

a base substrate, comprising: a display region and a peripheral region outside the display region, wherein the peripheral region comprises at least one bending region, a first subregion located between the at least one bending region and the display region, and a second subregion located on a side of the at least one bending region away from the display region;

a plurality of first connecting leads, located on a side of the base substrate, wherein the plurality of first connecting leads extend from the first subregion to the second subregion through the bending region, and the first connecting lead comprises: a first sub-connecting lead and a second sub-connecting lead;

an encapsulation layer, located on a side of the plurality of first connecting leads away from the base substrate, wherein the encapsulation layer covers the display region and extends to the first subregion;

a plurality of first touch signal traces, located on a side of the encapsulation layer away from the plurality of first connecting leads, wherein the plurality of first touch signal traces and the plurality of first connecting leads are in one-to-one correspondence; each first touch signal trace comprises a first sub-touch signal trace located in the first subregion and a second sub-touch signal trace located in the second subregion; and one end of each first connecting lead is electrically connected to the first sub-touch signal trace, and the other end of the first connecting lead is electrically connected to the second sub-touch signal trace;

a plurality of second connecting leads, located between the encapsulation layer and the plurality of first touch signal traces, or located in the same layer as the plurality of first touch signal traces, wherein the plurality of second connecting leads and the plurality of first connecting leads are in one-to-one correspondence; and the plurality of second connecting leads pass through the bending region, and are electrically connected to the first sub-touch signal trace and the second sub-touch signal trace in one-to-one correspondence; and a plurality of third connecting leads, located between the base substrate and the plurality of first connecting leads, and being in one-to-one correspondence with the plurality of first connecting leads; wherein one end of the third connecting lead is electrically connected to the first sub-connecting lead, and the other end of the third connecting lead is electrically connected to the second sub-connecting lead.

20. The display substrate according to claim 19, wherein the plurality of third connecting leads are located in the second subregion.

* * * * *